United States Patent
Lin et al.

(10) Patent No.: US 9,097,972 B2
(45) Date of Patent: Aug. 4, 2015

(54) METHOD OF APPLYING PHOTORESIST TO A SEMICONDUCTOR SUBSTRATE

(71) Applicant: Taiwan Semiconductor Manufacturing Co., Ltd., Hsin-Chu (TW)

(72) Inventors: Yen-Chen Lin, Hsinchu (TW); Ching-Hsin Chang, Hemei Township (TW); Chia-Hung Chu, Pingzhen (TW); Hu-Wei Lin, Hsinchu (TW); Chih-Hsien Hsu, Hsinchu (TW); Hong-Hsing Chou, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/752,954

(22) Filed: Jan. 29, 2013

(65) Prior Publication Data
US 2014/0210057 A1    Jul. 31, 2014

(51) Int. Cl.
| H01L 21/36 | (2006.01) |
| G03F 7/038 | (2006.01) |
| G03F 7/039 | (2006.01) |
| G03F 7/16 | (2006.01) |

(52) U.S. Cl.
CPC ............ *G03F 7/0387* (2013.01); *G03F 7/039* (2013.01); *G03F 7/162* (2013.01)

(58) Field of Classification Search
USPC ........................ 438/778, 780, 761; 427/240
See application file for complete search history.

(56) References Cited

U.S. PATENT DOCUMENTS

| 6,551,403 | B1 * | 4/2003 | Crabtree ................... 118/313 |
| 6,884,462 | B2 * | 4/2005 | Whitman .................. 427/240 |
| 6,946,407 | B2 * | 9/2005 | Davlin et al. ............. 427/240 |
| 7,718,551 | B2 * | 5/2010 | Liu et al. .................. 438/782 |
| 2001/0033895 | A1 * | 10/2001 | Minami et al. ............. 427/240 |
| 2008/0069948 | A1 * | 3/2008 | Yoshihara et al. ......... 427/240 |
| 2011/0129601 | A1 * | 6/2011 | Moore et al. .............. 427/240 |
| 2012/0021609 | A1 * | 1/2012 | Parbhoo et al. ........... 438/763 |

OTHER PUBLICATIONS

Li, X. et al., "Double Pre-Wet RRC (Reducing Resist Consumption) Process for Deep Ultraviolet Bottom Antireflective Coatings (BARC)", Advances in Resist Technology and Processing XXI, edited by John. L Sturtevant, Proceedings of SPIE, 2004, 5376:729-738.

* cited by examiner

*Primary Examiner* — Cuong Q Nguyen
*Assistant Examiner* — Nishath Yasmeen
(74) *Attorney, Agent, or Firm* — Duane Morris LLP; Steven E. Koffs (57) ABSTRACT

A method comprises dispensing a first solvent on a semiconductor substrate; dispensing a first layer of a high-viscosity polymer on the first solvent; dispensing a second solvent on the first layer of high-viscosity polymer; and spinning the semiconductor substrate after dispensing the second solvent, so as to spread the high-viscosity polymer to a periphery of the semiconductor substrate.

20 Claims, 6 Drawing Sheets

METHOD OF APPLYING PHOTORESIST TO A SEMICONDUCTOR SUBSTRATE

FIELD

This disclosure relates generally to semiconductor fabrication, and more specifically to use of photoresist in photolithographic processes.

BACKGROUND

During semiconductor fabrication, a variety of photolithographic processes are performed to apply layers to, or perform implants in, a semiconductor wafer. A photosensitive photoresist is applied to the wafer, and patterned using a photomask to form a hard mask for a subsequent deposition or etching process. The cost of photoresist is a significant material cost in semiconductor fabrication.

Some polyimide compositions are photosensitive, and can serve as a photoresist. Both "positive" and "negative" types of polyimide photoresist are used. Compared to other types of photoresist, polyimide has a much higher viscosity at its dispensing temperature. For example, some photoresists have a viscosity as low as 10 centipoise, and flow easily. Polyimide can have a viscosity of about 3000 centipoise, and does not spread as readily during dispensing.

If a high spinner rotation speed is used to spread polyimide over the surface of the wafer, a greater portion of the polyimide is spun off of the wafer by centrifugal force and wasted.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

The viscosity of polyimide photoresist is high (from 2 to 2000 times greater than other photoresists). Some embodiments use a reducing resist consumption (RRC) material for high viscosity fluids (i.e., viscosity ≥50 centipoise), such as polyimide. The bottom RRC layer partially reduces fluid viscosity. The inventors have found that, although the bottom fluid viscosity is lower than the center of the polyimide layer, the fluid at the top surface of the polyimide still has high viscosity. The high top surface viscosity makes the shear stress($\tau$) within the photoresist larger. Larger shear stress ($\tau$) results in use of a larger centrifugal force to spread the polyimide to the outer edge of the wafer, and causes the top fluid to spin out from the wafer quickly, wasting photoresist.

Figure 1:
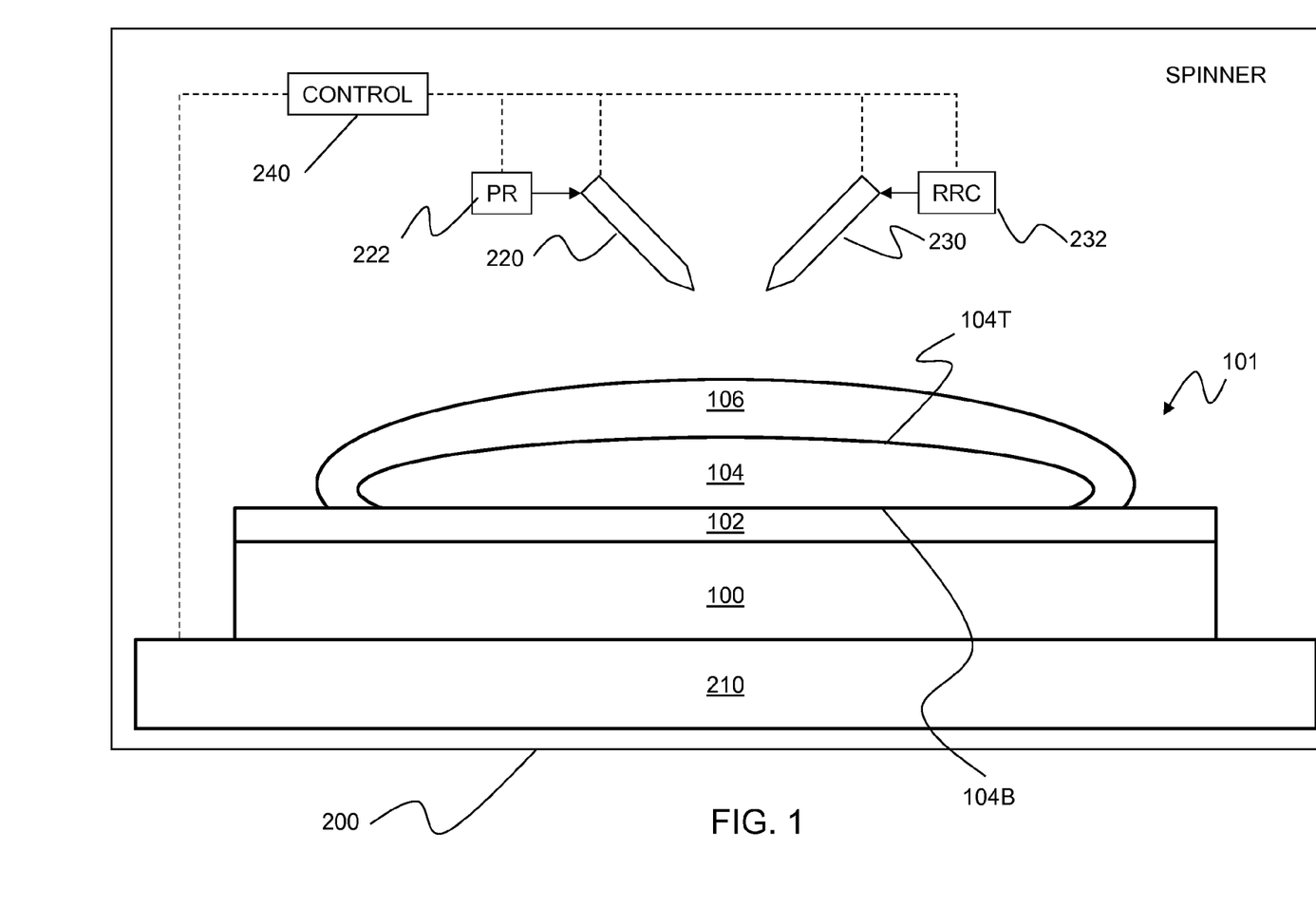
FIG. 1 is schematic diagram of a spinner, including a cross-sectional view of a substrate using reducing resist consumption (RRC) coating layers above and below a layer of photoresist.

FIG. 1 is a cross-sectional view of a tool for coating a semiconductor wafer 100 with a polymer. The tool can be a spinner 200, such as a photoresist spinner for example. The spinner 200 has a platen 210 for holding and rotating a semiconductor substrate. The spinner 200 has at least one nozzle 220, 230 for dispensing coatings onto the semiconductor substrate 100. In some embodiments, a first nozzle 220 dispenses a first polymer (e.g., a first photoresist) material from a polymer source, such as a photoresist source 222. In some embodiments, a second nozzle 230 dispenses a first reducing resist consumption (RRC) material from an RRC source 232. In some embodiments, the photoresist source 222 and RRC source 232 each has a respective pump for injecting the photoresist and RRC coating, respectively. In other embodiments (not shown), the photoresist and RRC material are both directed through a single nozzle, and injected by a single pump.

A control device 240 controls the speed of the platen 210 and the volumetric dispensing rates of the photoresist and RRC material. The control device 240 can be a microcontroller, an embedded microprocessor, or a microprocessor of a computer. In some embodiments, the control device is programmed to automatically control the platen speed and dispensing rates according to any of the methods described below.

The wafer 100 comprises a semiconductor substrate 100, a first reducing resist consumption (RRC) coating layer 102 on the semiconductor substrate, a first high-viscosity polymer layer (e.g., a photoresist layer 104 such as polyimide) on the first RRC coating layer 102, and a second RRC coating layer 106 on the first high-viscosity polymer (e.g., photoresist) layer 104. In some embodiments, the two RRC coating layers 102, 106 together surround the first polymer (e.g., photoresist) layer 104. In some embodiments, the first high-viscosity polymer (e.g., photoresist) layer 104 has a bottom major surface 104B near the substrate 100 and a top major surface 104T opposite the substrate 100. The first RRC coating layer 102 covers the bottom major surface 104B of the first polymer (e.g., photoresist) layer 104, and the second RRC coating layer 106 covers the top major surface 104T of the first polymer (e.g., photoresist) layer 104.

In some embodiments, the first RRC coating layer 102 is a solvent capable of dissolving the polymer. In some embodiments, the second RRC coating layer 106 is a solvent capable of dissolving the polymer. In some embodiments, the first and second RRC coating layers 102, 106 each comprise the same solvent. In other embodiments, the first and second RRC coating layers 102, 106 are different from each other.

In some embodiments, a volume ratio of the first RRC coating layer 102 (e.g., solvent) to the first polymer layer 104 is greater than 1:1, and a volume ratio of the second RRC coating layer 106 (e.g., solvent) to the first polymer layer 104 is greater than 1:1. In some embodiments, a volume ratio of the first solvent layer 102 to the first polymer layer 104 is at least 2:1, and a volume ratio of the second solvent layer 106 to the first polymer layer 104 is at least 2:1. In some embodiments, the control device 240 controls the sequence of depositing the layers 102, 104, 106 and the volume ratios.

The high-viscosity polymer 104 can be any of a variety of materials. In some embodiments, the polymer (e.g., photoresist) has a high viscosity of at least 50 centipoise. In some embodiments, the photoresist is a polyimide having a high viscosity in a range from 50 centipoise to 10,000 centipoise. In some embodiments, the photoresist is a polyimide having a high viscosity in a range from about 1,500 centipoise to about 3,000 centipoise.

For example, in some embodiments, the polymer is a polyimide or polybenzoxazole (PBO) film, from HD MicroSystems of Wilmington, Del., such as HD-4000 Series, HD-8800, 8900 PBO Series or HD8930 PBO Series for ultra low cure temperature. These are just examples, and other brands and types of photoresist can be used. Although examples are described below in which the photoresist is a high viscosity photoresist, the method can also be used with low viscosity photoresists. Further, the method can be applied to other high viscosity polymer (e.g., polyimide) films which are not photosensitive.

In some embodiments, the high-viscosity polymer is a photoresist injected as a polyimide precursor I-8320A, manufactured by Asahi Chemical corporation, Japan, and its viscosity is about 3000 centipoise (cp) at 23° C. Also 8124ER polyimide by Asahi.

Some embodiments use a positive photoresist formed from a Polybenzoxazole(PBO) precursor, such as Asahi PIMEL™ I-700, Asahi PIMEL™ AM-200. Can use negative PR such as Asahi PIMEL™ G-7000, Asahi PIMEL™ I-8000, or Asahi PIMEL™ BL or PIMEL™ BM/BG. Asahi KASEI Corp., Tokyo, JP.

The polymer can be an LaRC$^a$-8515 polyimide matrix resin, developed by NASA Langley Research Center, in Langley, Va.

In some embodiments, a polyimide layer 104 of up to 10 μm thickness is formed.

The RRC coating materials can be any of a variety of solvents suitable for polyimide photoresist. The solvent(s) has (have) a lower surface energy than the photoresist. For example, AZ Electronic Materials, K.K. of Tokyo, Japan, provides the following suitable materials. The solvent-developable negative tone PIMEL™ polyimide is processed using solvents including developer solutions. For example:

A-515 Developer cyclopentanone-based
A-330 Developer cyclohexanone-based blend
A-430 Developer clyclopentanone/cyclohexanone blend
C-260 Rinse PGMEA-based
C-265 Rinse PGME/PGMEA mixture Alternatively, Dupont's HD MicroSystems (Wilmington, Del.) produces solvent based, ancillary products for Dupont's line of negative tone photosensitive polyimides. This includes the HD-4100 Series products. In some embodiments, an HD-4100 polyimide is dissolved by a corresponding HD developer). For example, the solvent can be PA-400D Based on gamma butyrolactone (BLO), or PA-401D developer for the HD-4000 Series products, which is based on cyclopentanone (CPO).

In some embodiments, the RRC coating(s) is (are) any solvent capable of dissolving the polyimide-based polymer. For example, the solvent can be selected from the group consisting of N,N-dimethylformamide, N,N-dimethylacetamide, N-methylpyrrolidone, N-vinylpyrrolidone, N-methylcaprolactam, dimethylsulfoxide, tetramethylurea, pyridine, dimethylsulfone, hexamethylsulfoxide, m-cresol, γ-butyrolactone, ethyl cellosolve, butyl cellosolve, ethyl carbitol, butyl carbitol, ethyl carbitol acetate, butyl carbitol acetate, ethylene glycol, ethyl lactate, butyl lactate, cyclohexanone, cyclopentanone, and combinations thereof.

In some embodiments, the RRC coating is a polar solvents for polyimide selected from the group consisting of N,N-dimethylformamide, N,N-dimethylacetamide, N-methylpyrrolidone, N-vinyl pyrrolidone, N-methylcaprolactam, dimethylsulfoxide, tetramethylurea, pyridine, dimethylsulfone, hexamethylsulfoxide, m-cresol, γ-butyrolactone and combinations thereof.

In other embodiments, the RRC coating is a solvent such as Methyl Ethyl Ketone (MEK), such as FUJIFILM Electronic Materials' RER500, RER550; Propylene Glycol Monomethyl Ether Acetate (PGMEA), RER 600 and RER600 Fujifilm Electronic Materials, U.S.A., Inc. Mesa, Ariz.

In some embodiments, both the bottom solvent 102 and top solvent 106 are the same material as each other. For example, in some embodiments, both layers 102, 106 of solvent comprise cyclopentanone. In other embodiments, the top solvent 106 of can be a different material from the bottom solvent 102, as long as both solvents 102, 106 can be dissolved in the polymer (e.g., photoresist).

Figure 4:
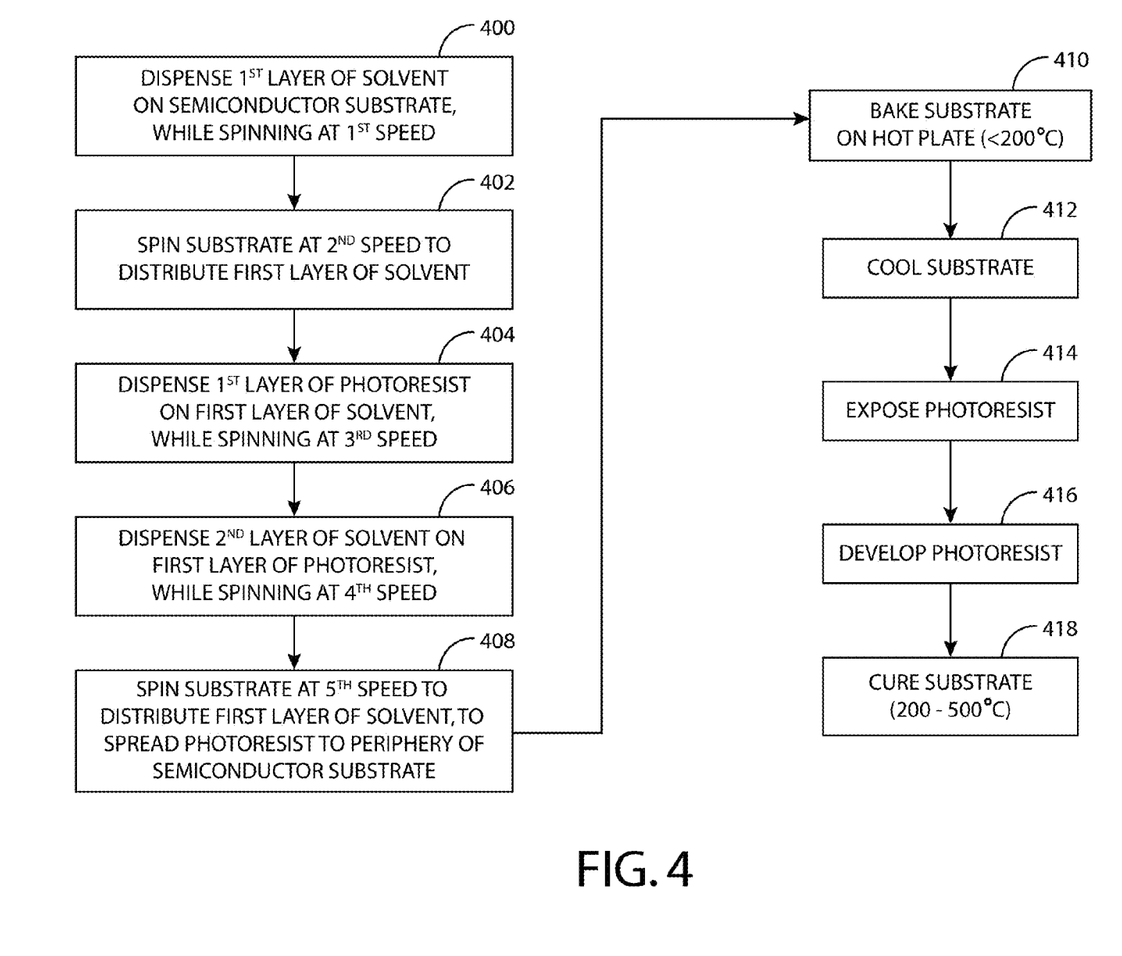
FIG. 4 is a flow chart of an method of applying at least two RRC coatings while dispensing photoresist.

FIGS. 2A-2C and 4 show a method for reducing resist consumption (RRC). FIG. 4 is a flow chart of the method. FIG. 2 graphically shows the substrate 100 during execution of the steps of FIG. 4.

Figure 2A:
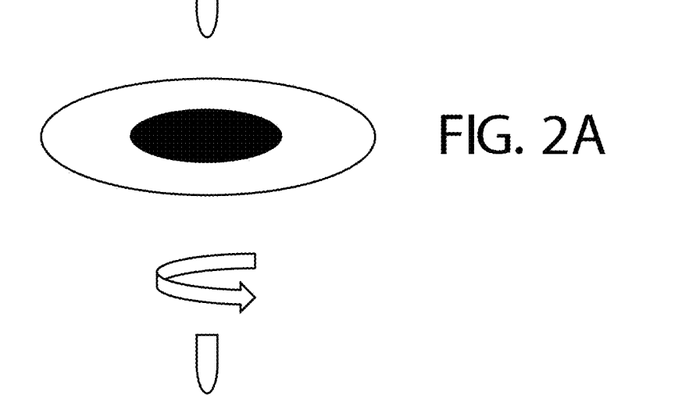
FIGS. 2A to 2C schematically show deposition of a first RRC coating, a polyimide coating and a second RRC coating, respectively, on the substrate of FIG. 1.

At step 400 of FIG. 4, a first RRC coating layer, such as a solvent, is dispensed on a semiconductor substrate, while spinning the substrate at a first speed. In some embodiments, the first speed is in a range from 0 to 500 revolutions per minute (RPM). The solvent can be any of the solvents described above. For example, a cyclopentanone or MEK based solvent can be used. This is shown in FIG. 2A.

At step 402, the substrate is spun at a second speed to distribute the first RRC layer (e.g., solvent). In some embodiments, the second speed is between 500 RPM and 5000 RPM.

Figure 2B:
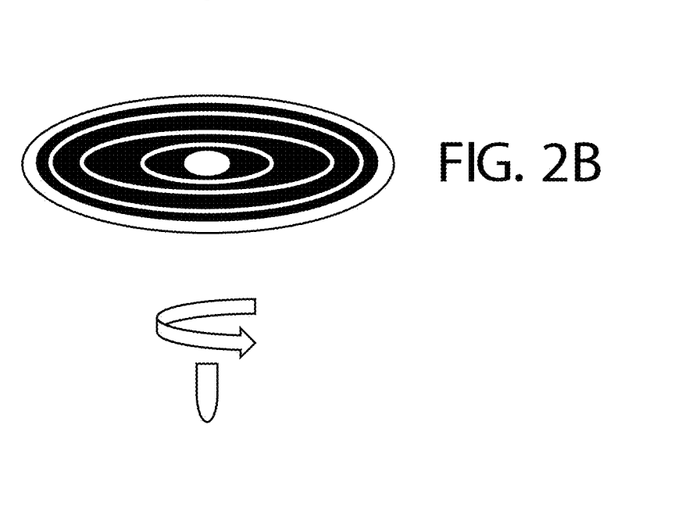

At step 404, a first layer of a high-viscosity polymer (e.g., photoresist) is dispensed on the first layer of solvent. In some embodiment, the wafer can be static during the polymer dispensing. In other embodiments, the polymer is dispensed while spinning the substrate at a third speed. In some embodiments, the third speed is in a range from 0 to 500 RPM, as shown in FIG. 2B. In some embodiments, the photoresist is a polyimide having a high viscosity in a range from about 1,500 centipoise to about 3,000 centipoise. In some embodiments, the high-viscosity polymer photoresist is dispensed at the center of the wafer, and is spread to the periphery of the wafer by centrifugal force.

Figure 2C:
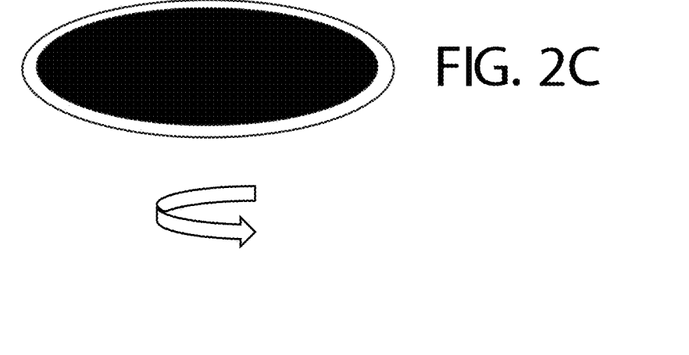

At step 406, after the high-viscosity polymer is dispensed onto the first RRC (solvent) layer, a second RRC layer (e.g., solvent) is dispensed on the first layer of high-viscosity polymer, while spinning the substrate at a fourth speed. In some embodiments, the fourth speed is in a range from 0 to 500 RPM, as shown in FIG. 2C. The second RRC layer is dispensed separately (after dispensing the photoresist layer) to avoid generation of micro bubbles, and to avoid reduction of the final polyimide thickness.

At step 408, after dispensing the second layer of RRC (e.g., solvent), the semiconductor substrate is spun at a fifth speed, so as to spread the polymer (e.g., photoresist) to a periphery of the semiconductor substrate. In some embodiments, the fifth speed used during step 408 is not substantially greater than the second speed used during step 402. For example, the second speed can be 500 RPM and the fifth speed can be 600 RPM. In some embodiments, during step 408, the substrate is spun at approximately the same second speed as during step 402, i.e., a same speed in a range from 500 RPM to 5000 RPM. In some embodiments, during steps 402 and 408, the substrate is spun at about 500 RPM.

In some embodiments, the second, third, fourth and fifth rotational speeds of the substrate during steps 402, 404, 406 and 408, respectively, are all within about 20% of the first speed used during step 400. In some embodiments, the substrate is spun at a substantially constant speed of about 500 RPM throughout steps 400, 402, 404, 406 and 408. Thus, the rotation speed can be maintained relatively low during and after dispensing the high viscosity polymer, reducing the amount of polymer which is spun off and wasted. Additionally, programming the rotation speed can be simplified by using a common speed throughout steps 400-408.

In some embodiments, during step 408 the fifth speed is different from the second speed used during step 402. For example, in some embodiments, after dispensing the second layer of solvent, the substrate is spun at a fifth speed slower than the speed at which the substrate would be spun to spread the polymer if the second layer of solvent were not included. In other embodiments, the first, second, third, fourth and fifth speeds are all different from each other.

At step 410, after the spinning spreads the photoresist to the periphery of the wafer, the substrate is baked on a hot plate at a temperature of below 200 degrees Celsius.

At step 412, the substrate is cooled.

At step 414, the photoresist is exposed using a photomask.

At step 416, the photoresist is developed. After developing, desired areas of photoresist are insoluble, and undesired areas of the photoresist are soluble. The soluble photoresist can then be dissolved and removed, leaving a pattern on the substrate.

At step 418, the substrate is then cured at a temperature in a range from 200° C. to 500° C.

Figure 3:
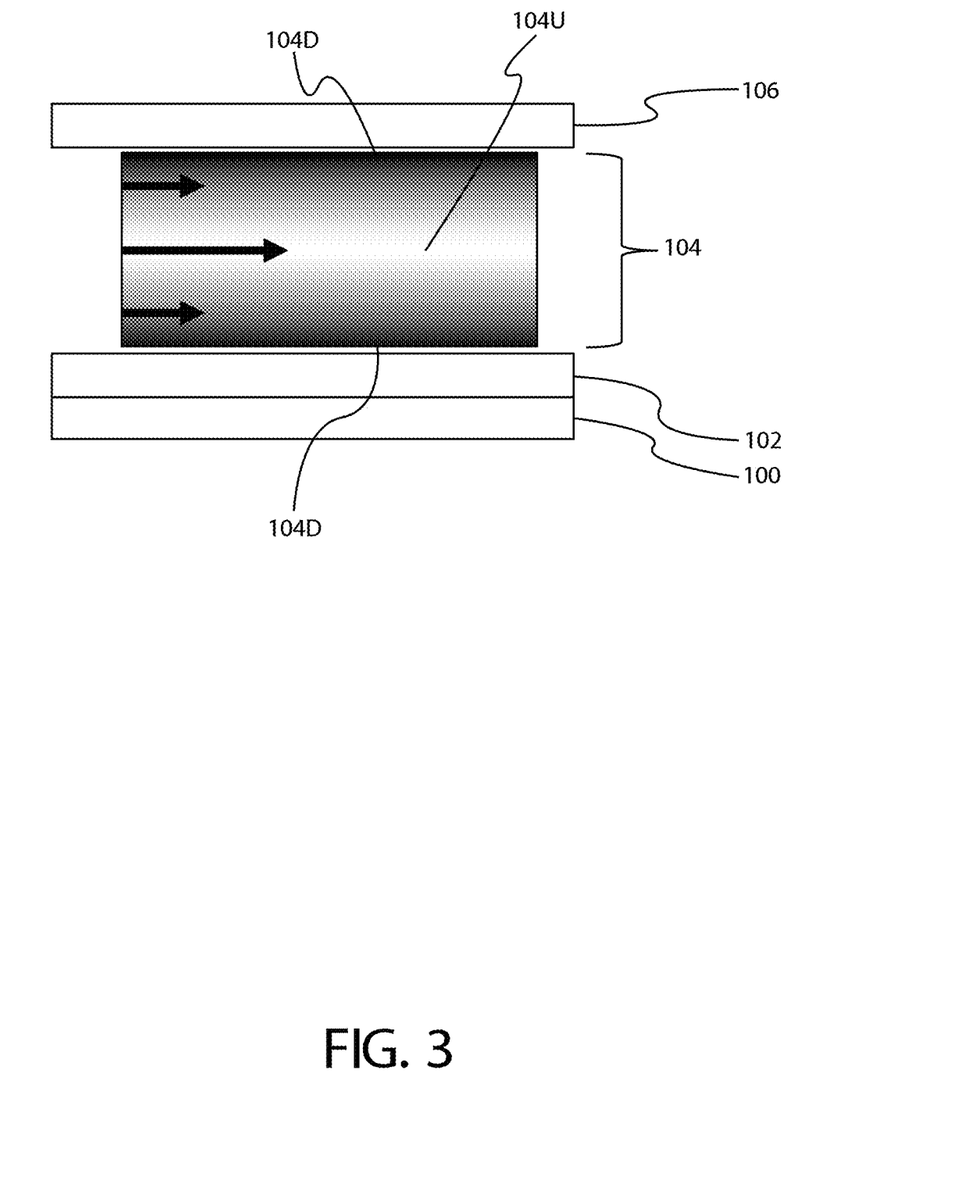
FIG. 3 shows a detail of the photoresist of FIG. 1.

FIG. 3 is a cross sectional view showing an enlarged detail of the first photoresist layer 104 after dispensing the second RRC coating layer 106. The solvent of the first and second RRC coating layers 102, 106 dissolves into the photoresist in the outer regions 104D of the photoresist. The viscosity of the photoresist is thus reduced near the bottom surface 104B and top surface 104T. This also reduces the friction force(f) within the photoresist and between the photoresist and the wafer. It makes the photoresist viscosity lower, so the photoresist extends smoothly. This permits a greater velocity gradient within the photoresist, and greater radial speed of the photoresist, especially at the undissolved center portion 104U of the photoresist.

The shear stress (shear force per unit area) is given by:

$$\tau = \frac{F}{A}$$
$$= \mu \frac{\partial v}{\partial Y},$$

where:
τ is the shear stress;
F is the fluid force
μ is the viscosity;
v is the flow velocity
Y is the fluid height
r is the radius; and
ω is the angular speed Because viscosity is a measure of the resistance of a fluid which deformed by shear stress(τ) reducing the viscosity of the photoresist near its top and bottom surfaces can reduce internal friction force in the photoresist fluid itself.

The methods described herein can be used in various photoresist processes, including front-end-of-line, back-end-of-line, and bumping processes. The method can be used for dispensing other high-viscosity polymer films.

Advantageously, dispensing the second RRC layer 106 on the photoresist 104 causes even a high viscosity polymer, such as polyimide, to extend smoothly to the whole wafer. The variation in average polyimide film thickness between wafers is reduced. Also, the uniformity of the photoresist layer within each individual wafer is improved, and there is a smaller difference between the resist thickness near the circumference of the wafer and the resist thickness near the center of the wafer. The second RRC layer 106 permits a reduction in the rotation speed of the spinner to extend the photoresist to the edge of the wafer, or a reduction in the spinning time, or both. Reduction in the spinning speed or spinning time reduces the amount of photoresist which is ejected from the wafer (and thus reduces photoresist wastage). For example, the inventor estimates that this method can reduce usage of a polyimide photoresist by up to 77% relative to other methods without the second RRC coating layer.

Figure 5:
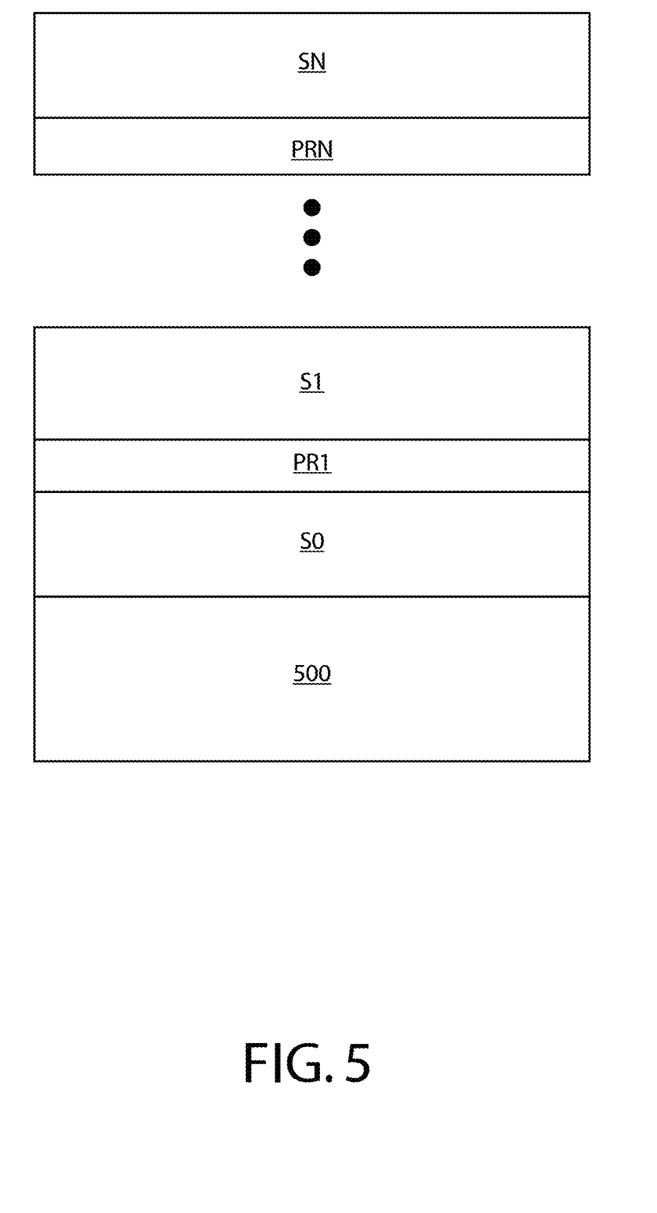
FIG. 5 is a diagram of a substrate on which one or more additional photoresist layer and one or more additional RRC coating are dispensed.

FIG. 5 is a cross sectional diagram of a second embodiment of a wafer used in an RRC process. The wafer 500 of FIG. 5 has N layers of photoresist and N+1 RRC layers (where N is an integer greater than 1).

In some embodiments, N=2, so that the wafer 500 has two layers of photoresist PR1, PR2 and three layers of RRC (solvent), S0, S1 and S2. Each photoresist layer PR1, PR2 has a solvent layer on its top and bottom surfaces. The solvent can be any of the solvents described above. For example, an MEK based solvent can be used.

The method of FIG. 5 includes dispensing a first layer S0 of solvent on a semiconductor substrate 500. The substrate 500 is spun at a first speed to distribute the first layer S0 of solvent. A first layer PR1 of a photoresist (e.g., polyimide having a viscosity of 1500 to 3000 centipoise at a dispensing temperature) is dispensed on the first layer of solvent S0 while spinning the substrate at a second speed. Then the substrate is spun at a third speed. A second layer of solvent S1 is dispensed on the first layer of photoresist while spinning the substrate at a fourth speed. The solvent S1 can be the same material as solvent layer S0. A second layer PR2 of a photoresist is dispensed on the second layer of solvent S1 while spinning the substrate at a fifth speed. A third layer of solvent S2 is dispensed on the second layer PR2 of photoresist while spinning the substrate at a sixth speed. Then the substrate is spun at a seventh speed, so as to spread the PR1 and PR2 to a periphery of the semiconductor substrate.

In some embodiments, a volume ratio of the first, second and third solvent layers S0, S1, S2 to the first photoresist layer PR1 is at least 2:1, and a volume ratio of the first, second and third solvent layers S0, S1, S2 to the second photoresist layer PR2 is at least 2:1. In some embodiments, the volume ratio of the first, second and third solvent layers S0, S1, S2 to the first photoresist layer PR1 is about 8:3, and a volume ratio of the first, second and third solvent layers S0, S1, S2 to the second photoresist layer PR2 is about 8:3.

In some embodiments, the first speed is in a range from 1000 revolutions per minute (RPM) to 5000 RPM, and the second speed is about 500 RPM or less during and after dispensing the first layer of photoresist.

In other embodiments, N is greater than two. For example, the substrate 500 has three polymer layers and four solvent layers. In another example, the substrate 500 has four polymer layers and five solvent layers. One of ordinary skill can use any desired number N of polymer layers, sandwiched among N+1 solvent layers in an alternating arrangement.

In some embodiments, as shown in FIG. 1, an article of manufacture 101 comprises: a semiconductor wafer 100, a layer of a first solvent 102 above the semiconductor wafer 100, a first layer of a high-viscosity polymer 104 on the layer of the first solvent 102, and a layer of a second solvent 106 on the first layer of the high-viscosity polymer 104. For example, in some embodiments, the first solvent 102 and second solvent 106 both comprise cyclopentanone, and the high-viscosity polymer 104 is a polyimide photoresist having a viscosity in a range from about 1500 centipoise and 3000 centipoise.

Figure 6A:
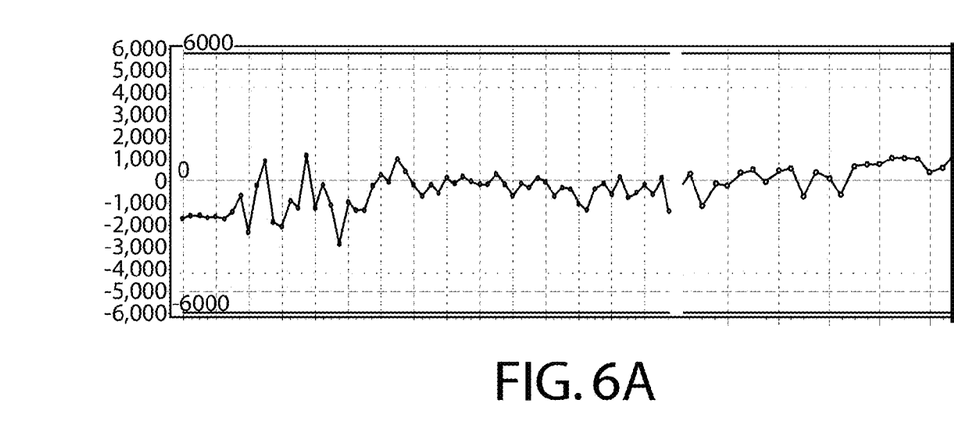
FIGS. 6A and 6B show average film thickness accuracy for substrates to which a polyimide layer is applied without, and with, the second solvent, respectively.
Figure 6B:
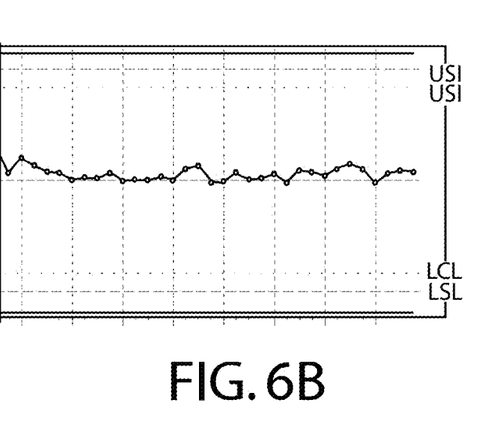

FIGS. 6A and 6B show how the accuracy of the average thickness of the layer of high-viscosity polymer 104 (among plural wafers) is improved when the layer of second solvent 106 is included. FIG. 6B shows the average thickness of a polyimide film over the substrate 100 for a plurality of substrates, when the layer of second solvent 106 is included, as shown in FIG. 1. FIG. 6A shows average film thickness for otherwise similar substrates formed without the layer of second solvent 106. The wafers in FIG. 6B display substantially smaller deviation in average thickness compared to the wafers in FIG. 6A formed using only a single layer of the first solvent 102 (without solvent 106). Thus, thickness accuracy is better when the second solvent is included, as in FIG. 6B.

Figure 6C:
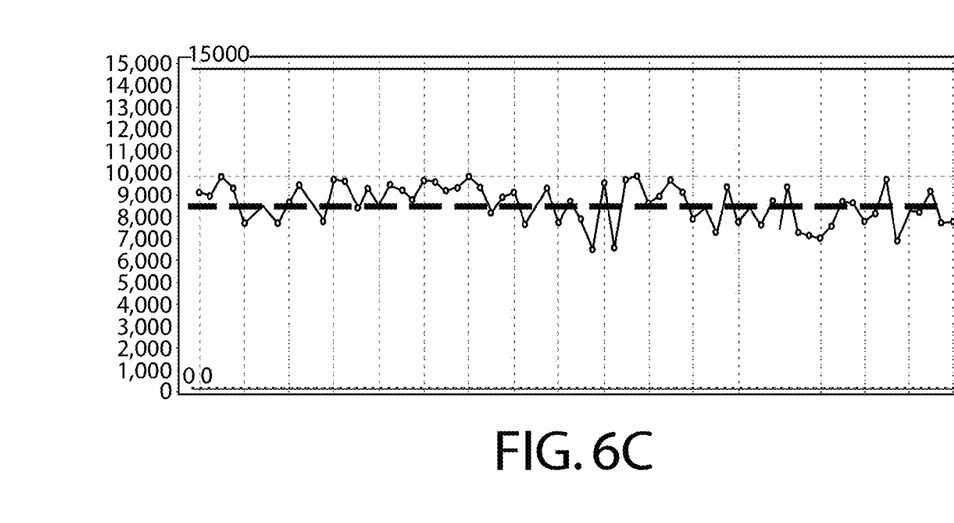
FIGS. 6C and 6D show range (uniformity) of film thickness for substrates to which a polyimide layer is applied without and with the second solvent, respectively.
Figure 6D:
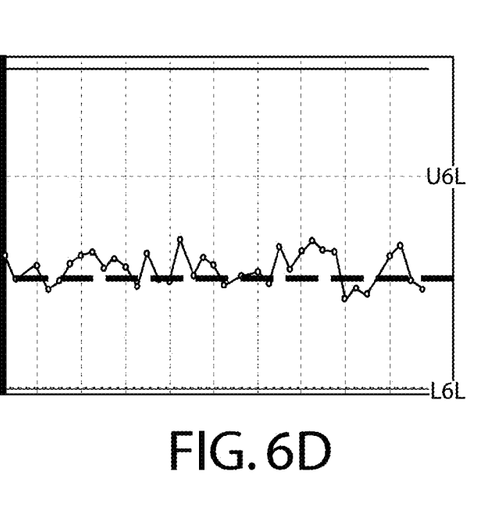

FIGS. 6C and 6D show how the uniformity of thickness of the layer of high-viscosity polymer 104 (within individual wafers) is improved when the layer of second solvent 106 is included. FIG. 6D shows the range of thickness of a polyimide film over the substrate 100, when the layer of second solvent 106 is included, as shown in FIG. 1. FIG. 6C shows range of thickness of polyimide film thickness for otherwise similar substrates formed without the layer of second solvent 106. The wafers in FIG. 6D display substantially smaller range of thickness within each wafer, compared to the wafers in FIG. 6C formed using only a single layer of the first solvent 102 (without solvent 106). Thus, within-wafer thickness uniformity is improved when the second solvent is included, as in FIG. 6D.

In some embodiments, a method comprises dispensing a first solvent on a semiconductor substrate; dispensing a first layer of a high-viscosity polymer on the first solvent; dispensing a second solvent on the first layer of high-viscosity polymer; and spinning the semiconductor substrate after dispensing the second solvent, so as to spread the high-viscosity polymer to a periphery of the semiconductor substrate.

In some embodiments, a volume ratio of the second solvent to the first layer of high-viscosity polymer is greater than 1:1.

In some embodiments, a volume ratio of the first solvent to the first layer of photoresist is at least 2:1.

In some embodiments, a volume ratio of the second solvent to the first layer of high-viscosity polymer is at least 2:1.

In some embodiments, the high-viscosity polymer has a viscosity in a range from 1,500 centipoise to 3,000 centipoise.

In some embodiments, the first solvent and the second solvent are a same material as each other.

In some embodiments, the fifth speed is in a range from about 500 to 1000 revolutions per minute.

In some embodiments, the high-viscosity polymer is a polyimide.

In some embodiments, the high-viscosity polymer is a polyimide, a volume ratio of the first layer of solvent to the first layer of high-viscosity polymer is at least 2:1, and a volume ratio of the second layer of solvent to the first layer of high-viscosity polymer is at least 2:1.

In some embodiments, the step of dispensing the first solvent includes spinning the substrate at a speed from 0 revolutions per minute (RPM) to 500 RPM.

Some embodiments further include spinning the substrate at a speed from 0 RPM to about 500 RPM during and after dispensing the first layer of high viscosity polymer.

In some embodiments, the solvent comprises cyclopentanone.

Some embodiments further comprise dispensing a second layer of high viscosity polymer on the second solvent; and dispensing a third solvent on the second layer of high viscosity polymer.

In some embodiments, a method, comprises dispensing a first solvent on a semiconductor substrate; spinning the substrate at a first speed to distribute the first solvent; dispensing a first layer of a photoresist on the first solvent; dispensing a second solvent on the first layer of photoresist; and spinning the semiconductor substrate at a second speed that is not substantially greater than the first speed after dispensing the second layer of solvent, so as to spread the photoresist to a periphery of the semiconductor substrate.

In some embodiments, the photoresist is a polyimide, a volume ratio of the first solvent to the first layer of photoresist is at least 2:1, and a volume ratio of the second solvent to the first layer of photoresist is at least 2:1.

In some embodiments, the first speed is in a range from about 500 revolutions per minute (RPM) to 5000 RPM, and the second speed differs from the first speed by 20% or less.

In some embodiments, the photoresist is a polyimide having a viscosity of between about 1500 centipoise and 3000 centipoise at a dispensing temperature.

In some embodiments, the photoresist is a polyimide having a viscosity of at least 1500 centipoise, a volume ratio of the first solvent to the first layer of photoresist is at least 2:1, a volume ratio of the second solvent to the first layer of photoresist is at least 2:1, the first speed is in a range from 500 revolutions per minute (RPM) to 5000 RPM, and the second speed is in a range from about 500 RPM to 600 RPM during and after dispensing the first layer of photoresist.

In some embodiments, an article comprises: a semiconductor wafer, a layer of a first solvent above the semiconductor wafer, a first layer of a high-viscosity polymer on the layer of the first solvent, and a layer of a second solvent on the first layer of the high-viscosity polymer.

In some embodiments, the first solvent and second solvent both comprise cyclopentanone, and the high-viscosity polymer is a polyimide photoresist having a viscosity in a range from about 1500 centipoise and 3000 centipoise.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method, comprising:
   dispensing a first solvent on a semiconductor substrate;
   dispensing a first layer of a high-viscosity polymer on the first solvent;
   dispensing a second solvent on a top surface of the first layer of the high-viscosity polymer; and
   spinning the semiconductor substrate after dispensing the second solvent, so as to spread the high-viscosity polymer to a periphery of the semiconductor substrate, wherein the spinning step spreads the second solvent to cover the entire top surface of the high viscosity polymer and wrap around beneath an outer edge of the high viscosity polymer.

2. The method of claim 1, wherein a volume ratio of the second solvent to the first layer of high-viscosity polymer is greater than 1:1.

3. The method of claim 1, wherein a volume ratio of the first solvent to the first layer of high-viscosity polymer is at least 2:1.

4. The method of claim 1, wherein a volume ratio of the second solvent to the first layer of high-viscosity polymer is at least 2:1.

5. The method of claim 1, wherein the high-viscosity polymer has a viscosity in a range from 1,500 centipoise to 3,000 centipoise.

6. The method of claim 1, wherein the first solvent and the second solvent are a same material as each other.

7. The method of claim 1, further comprising:
   dispensing a second layer of a high viscosity polymer on the second solvent; and
   dispensing a third solvent on the second layer of high viscosity polymer.

8. The method of claim 1, wherein the high-viscosity polymer is a polyimide.

9. The method of claim 1, wherein the high-viscosity polymer is a polyimide, a volume ratio of the first solvent to the first layer of high-viscosity polymer is at least 2:1, and a volume ratio of the second solvent to the first layer of polymer is at least 2:1.

10. The method of claim 1, wherein the step of dispensing the first solvent includes spinning the substrate at a speed from 0 revolutions per minute (RPM) to 500 RPM.

11. The method of claim 9, further comprising spinning the substrate at a speed of from 0 RPM to about 500 RPM during and after dispensing the first layer of high-viscosity polymer.

12. The method of claim 1, wherein the solvent comprises cyclopentanone.

13. The method of claim 7, wherein the step of dispensing a second layer of a high viscosity polymer includes spinning the semiconductor substrate at a speed in a range from about 500 to 1000 revolutions per minute.

14. The method of claim 1, wherein the first solvent and second solvent together surround the high viscosity polymer after the spinning.

15. A method, comprising:
    dispensing a first solvent on a semiconductor substrate;
    dispensing a first layer of a high-viscosity polymer on the first solvent;
    dispensing a second solvent on a top surface of the first layer of the high-viscosity polymer;
    spinning the semiconductor substrate after dispensing the second solvent, so as to spread the high-viscosity polymer to a periphery of the semiconductor substrate, so that the second solvent covers the entire top surface of the high viscosity polymer and wraps around beneath an outer edge of the high viscosity polymer, and the first and second solvent together surround the high viscosity polymer after the spinning;
    dispensing a second layer of the high viscosity polymer on the second solvent; and
    dispensing a third solvent on the second layer of high viscosity polymer.

16. The method of claim 15, wherein a volume ratio of the first solvent to the first layer of photoresist is at least 2:1, and a volume ratio of the second solvent to the first layer of photoresist is at least 2:1.

17. The method of claim 16, wherein the step of dispensing the first solvent includes spinning the substrate at a speed from 0 revolutions per minute (RPM) to 500 RPM, further comprising spinning the substrate at a speed of from 0 RPM to about 500 RPM during and after dispensing the first layer of high-viscosity polymer.

18. A method, comprising:
    dispensing a first layer of cyclopentanone on a semiconductor substrate;
    dispensing a first layer of polyimide on the cyclopentanone;
    dispensing a second layer of cyclopentanone on a top surface of the first layer of polyimide; and
    spinning the semiconductor substrate after dispensing the second layer of cyclopentanone, so as to spread the polyimide to a periphery of the semiconductor substrate, including spreading the second layer of cyclopentanone to cover the entire top surface of the first layer of polyimide and wrap around beneath an outer edge of the polyimide.

19. The method of claim 18, wherein the first layer of cyclopentanone and second layer of cyclopentanone together surround the first layer of polyimide after the spinning, and wherein a volume ratio of the first layer of cyclopentanone to the first layer of polyimide is at least 2:1, and a volume ratio of the second layer of cyclopentanone to the first layer of polyimide is at least 2:1.

20. The method of claim 18, further comprising:
    dispensing a second layer of polyimide on the second layer of cyclopentanone; and
    dispensing a third layer of cyclopentanone on the second layer of polyimide.

* * * * *